(12) United States Patent
Fujii et al.

(10) Patent No.: US 7,301,159 B2
(45) Date of Patent: Nov. 27, 2007

(54) CHARGED PARTICLE BEAM APPARATUS AND METHOD OF FORMING ELECTRODES HAVING NARROW GAP THEREBETWEEN BY USING THE SAME

(75) Inventors: Toshiaki Fujii, Chiba (JP); Masao Abe, Chiba (JP); Kunji Shigeto, Saitama (JP); Minuru Kawamura, Saitama (JP); Alekber Yu Kasumov, Saitama (JP); Kazuhito Tsukagoshi, Saitama (JP); Yoshinobu Aoyagi, Saitama (JP)

(73) Assignee: Riken & SII NanoTechnology Inc. (JP)

( * ) Notice: Subject to any disclaimer, the term of this patent is extended or adjusted under 35 U.S.C. 154(b) by 287 days.

(21) Appl. No.: 11/196,094

(22) Filed: Aug. 3, 2005

(65) Prior Publication Data

US 2006/0038137 A1 Feb. 23, 2006

(30) Foreign Application Priority Data

Aug. 20, 2004 (JP) .............................. 2004-240998

(51) Int. Cl.
*A61N 5/00* (2006.01)

(52) U.S. Cl. .............................. 250/492.1; 250/492.2; 250/492.23; 250/306; 250/310; 216/63; 438/690

(58) Field of Classification Search ...................... None
See application file for complete search history.

(56) References Cited

U.S. PATENT DOCUMENTS

| | | | | |
|---|---|---|---|---|
| 5,852,298 A | * | 12/1998 | Hatakeyama et al. .... | 250/492.2 |
| 6,452,174 B1 | * | 9/2002 | Hirose et al. ............... | 250/309 |
| 6,716,301 B2 | * | 4/2004 | Kanno et al. .......... | 156/345.28 |
| 6,794,663 B2 | * | 9/2004 | Shichi et al. .......... | 250/492.21 |
| 7,060,196 B2 | * | 6/2006 | Makarov et al. .............. | 216/63 |
| 7,071,475 B2 | * | 7/2006 | Tomimatsu et al. .... | 250/442.11 |
| 7,103,505 B2 | * | 9/2006 | Teshima et al. ............ | 702/183 |
| 7,106,425 B1 | * | 9/2006 | Bultman et al. ............... | 356/73 |
| 7,138,628 B2 | * | 11/2006 | Tomimatsu et al. ......... | 250/306 |
| 7,176,458 B2 | * | 2/2007 | Tomimatsu et al. ......... | 250/306 |
| 7,205,237 B2 | * | 4/2007 | Deering et al. ............. | 438/690 |
| 7,241,994 B2 | * | 7/2007 | Hasegawa et al. .......... | 250/310 |

* cited by examiner

*Primary Examiner*—David Vanore
(74) *Attorney, Agent, or Firm*—Adams & Wilks

(57) ABSTRACT

A focused ion beam apparatus having two pieces of probers brought into contact with two points of a surface of a sample, a voltage source for applying a constant voltage between the two points with which the probers are brought into contact, and an ammeter for measuring a current flowing between the two points, in which a conductive film is formed to narrow a gap thereof between the two points by operating a deflection electrode and a gas gun and the current flowing between the two points is monitored, and when the current becomes a predetermined value, a focused charged particle beam irradiated to the surface of the sample is made OFF by the blanking electrode.

14 Claims, 3 Drawing Sheets

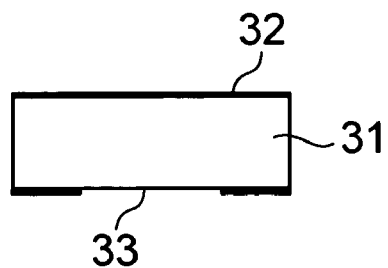
FIG. 2A
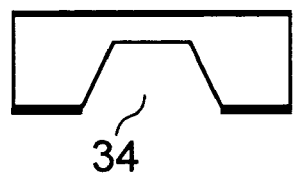
FIG. 2B
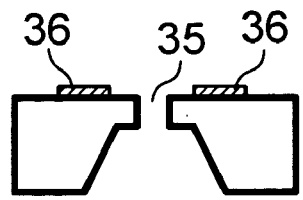
FIG. 2C
FIG. 3
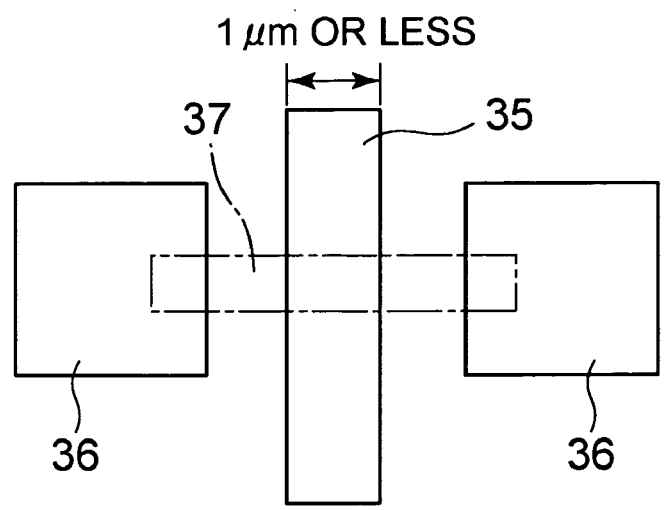

CHARGED PARTICLE BEAM APPARATUS AND METHOD OF FORMING ELECTRODES HAVING NARROW GAP THEREBETWEEN BY USING THE SAME

BACKGROUND OF THE INVENTION

The present invention relates to an apparatus of forming an electrode with gas assist deposition using a charged particle beam and a method of using the same.

In recent years, a technology of fabricating an integrated circuit is remarkable, and an integration degree is significantly promoted. Further, in order to realize more highly integrated formation, basic researches on molecule elements and single electron elements have been promoted.

In developing the molecule element, in order to grasp properties of the molecule, it is necessary to measure a conduction property thereof. Hence, electrodes having a gap of a molecule size (about 1 nm) therebetween are fabricated, a molecule is interposed in the gap, and various properties are measured.

As a method of fabricating a narrow gap, for example, there is a method of using a sputtering etching technology of a focused ion beam. According thereto, an electric wire comprising a conductive substance formed on an insulating film is etched by using a focused ion beam and an argon ion beam to form electrodes having a width of a gap of 5 nm therebetween (refer to Nonpatent Reference 1).

[Nonpatent Reference 1] "Fabrication of nano-gap electrodes for measuring electrical properties of organic molecules using a focused ion beam", Solid Thin Film 438-439 (2003) 374-377

However, according to the method of fabricating a narrow gap by using a sputtering etching of a focused ion beam, there poses a problem that a lower limit of a width of the gap formed is rectified by a beam diameter of the focused ion beam.

It is a problem of the invention to resolve the above-described problem to form a pair of electrodes having an extremely narrow gap width equal to or smaller than a beam diameter of a focused ion beam.

SUMMARY OF THE INVENTION

In order to resolve the above-described problem, a charged particle beam apparatus according to the invention is constituted by a charged particle source, a focusing lens system for focusing a charged particle beam drawn out from the charged particle source, a blanking electrode for making the focused charged particle beam ON/OFF on a sample, a deflection electrode for deflecting to scan the focused charged particle beam, a movable sample stage mounted with the sample irradiated with the focused charged particle beam, a gas gun for locally blowing a gas to a position of irradiating the focused charged particle beam on a surface of the sample, a secondary charged particle detector for detecting a secondary charged particle generated by irradiating the focused charged particle beam to the sample, two pieces of probers brought into contact with two points on the surface of the sample, a voltage source for applying a constant voltage between the two points with which the probers are brought into contact, and an ammeter for measuring a current flowing between the two points.

As operation of principal means having the above-described constitution, the electrodes having the extremely narrow gap therebetween can be formed without depending on a size of a beam diameter of the focused charged particle beam by forming a deposition film between the two points of the surface of the sample with which the probers are brought into contact by scanning to irradiate the focused charged particle beam while blowing a gas to the surface of the sample from the gas gun, applying the constant voltage between the two points with which the probers are brought into contact, measuring the current flowing between the two points, detecting that the current value becomes larger than a predetermined value, and making the focused charged particle beam irradiated to the surface of the sample OFF by the blanking electrode based on a signal thereof.

As described above, according to the apparatus and the method of the invention, when the electrodes are formed by CVD using the charged particle beam, the conductive film is formed to narrow the interval between the electrodes, the interval is controlled by measuring the current flowing between the electrodes at this occasion and therefore, the electrodes having the gap therebetween equal to or smaller than 1 nm can be fabricated for evaluating electric properties of an extremely small substance of a molecule, a gene or the like. Thereby, researches and industrialization of a molecule element or biotechnology are promoted.

BRIEF DESCRIPTION OF THE DRAWINGS

FIGS. 2A-2C show an example of a method of fabricating a sample used in the invention.

FIG. 3 shows an example of a method of fabricating an electrode according to the invention.

DETAILED DESCRIPTION OF THE INVENTION

An embodiment of the invention will be explained in details in reference to the drawings as follows.

Figure 1:
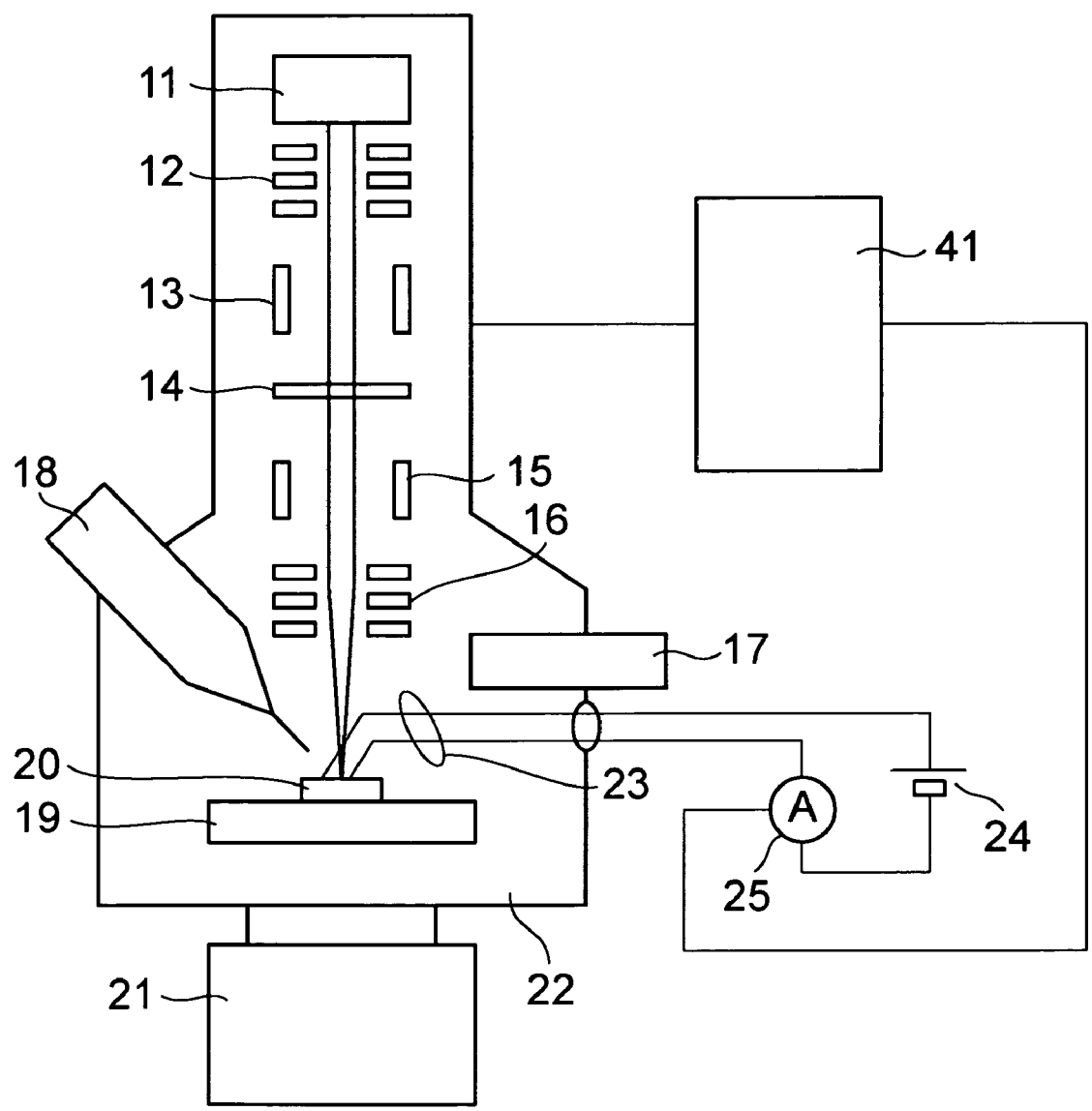
FIG. 1 shows a constitution example of an apparatus according to the invention.

FIG. 1 shows an example of a focused ion beam apparatus according to the invention.

A focused ion beam lens-barrel mainly comprises an ion source portion 11, a condenser lens 12, a blanking electrode 13, a movable diaphragm 14, a deflection electrode 15, an object lens 16, and an optical axis correcting electrode, an astigmatism correcting electrode and the like, not illustrated.

It is general to use liquid metal gallium for the ion source. Liquid metal gallium stored in a holding portion is supplied to an emitter in a needle-like shape by a surface tension. Further, a gallium reservoir, the emitter are made to be able to be heated by a filament. The emitter portion is applied with an electric field by a single or a plurality of electrodes, and gallium stored in the emitter portion is drawn out as an ion beam. Since the emitter is applied with a high voltage of about +30 kV relative to the ground potential, the ion beam is accelerated by the electric field.

The ion beam is focused by the condenser lens 12, and focused on a surface of a sample 20 by the object lens 16. The blanking electrode 13 is made to be able to generate a large electric field between two sheets of electrodes opposed to each other. When the respective electrodes are applied with the same potential, normally, the ground potential, the ion beam reaches the sample 20. However, when a large electric field is generated by applying signals having a large potential difference therebetween to the respective electrodes of the blanking electrode 13, the ion beam is considerably deflected to impinge on a blocking member of the movable diaphragm 14 or the like and the ion beam does not reach the surface of the sample 20.

The deflection electrode 15 is constituted by at least two sets of electrodes comprising two electrodes opposed to each other, and a trajectory of the ion beam is two-dimensionally controlled by electric fields generated between the respective electrodes.

Respective power sources for generating signals applied to the respective electrodes, the movable diaphragm are controlled by an apparatus control computer.

Further, a detector 17 detects secondary charge particles generated when the ion beam is irradiated to the surface of the sample 20 to convert to an electric signal. An output signal thereof is inputted to the apparatus control computer, and by storing the output signal along with a position of irradiating the ion beam, the surface of the sample 20 can be observed.

A sample stage 19 is movable at least in three axes of horizontal X, Y and vertical Z. The horizontal direction X-Y axes are used for observing the sample and determining a machining position. Further, the Z axis is used such that a height of the surface of the sample is always disposed at a position optimum for irradiating the focused ion beam. Otherwise, an inclining T axis, a rotating R axis or the like can also be provided.

A thin film is fabricated by a beam assisted CVD method by a compound vapor blowing apparatus 18 mounted to the focused ion beam apparatus. In the beam assisted CVD method, there is used compound vapor including a material of the thin film deposited on the surface of the sample 20. The compound vapor is blown to the surface of the sample 20 by the compound vapor blowing apparatus 18. The compound vapor blown to the surface of the sample 20 is adsorbed by the surface of the sample 20. When the focused ion beam is irradiated under the state, the compound vapor is decomposed by kinetic energy thereof or energy of second electrons generated in accordance with irradiation of the focused ion beam. A decomposed gas component is exhausted to outside of a sample chamber 22 by a vacuum pump 21, and a solid component thereof remains on the surface of the sample by constituting the thin film. At this occasion, the focused ion beam executes also sputter etching simultaneously with deposition. Therefore, it is necessary to control an amount of introducing the compound vapor and an amount of irradiating the focused ion beam such that a rate of fabricating the thin film by deposition becomes higher than a rate of machining by sputter etching.

Further, although a single one of the compound vapor blowing apparatus 18 is illustrated in the drawing, a plurality of compound vapor blowing apparatus may be used such that gasses can properly be used in accordance with objects.

The sample chamber 22 and the focused ion beam lens-barrel are vacuumed by the vacuum pump 21. Further, although not illustrated, there can also be provided a load/lock chamber for putting in and out a sample to and from the sample chamber without exposing the sample chamber to the atmosphere.

Further, there is mounted a manipulator 23 capable of being brought into contact with two portions of the surface of the sample 20. A voltage source 24 and an ammeter 25 are connected between two electrodes, and a resistance between two points is made to be able to be measured. When a value of the ammeter 25 becomes larger than a predetermined value, an input signal to the blanking electrode 13 is controlled based on the signal to thereby prevent the focused ion beam from reaching the surface of the sample 20.

Successively, the sample will be explained in reference to FIGS. 2A-2C.

As a material of a board, a silicon plate having face orientation of <100> is used. However, the face orientation is not particularly limited to <100>. A groove is formed in the silicon board 31 by using an MEMS technology. As shown by FIG. 2A, for example, a silicon oxide film or a silicon nitride film is formed as a mask member 32 to cover the silicon board 31, further, a window 33 is formed by using a photolithography technology.

Further, as shown by FIG. 2B, a membrane 34 is formed by anisotropic etching based on the face orientation by dipping the board into an alkali solution of potassium hydroxide solution or the like. At this occasion, although a thickness of the membrane is preferably as thin as possible, the thickness is preferably, for example, equal to or smaller than several micrometers.

Successively, as shown by FIG. 2C, a through hole 35 is formed at the membrane portion by using the focused ion beam. The through hole is preferably a long hole having a width equal to or smaller than 1 micrometer and a length of several micrometers. Further, a total of the board is covered with an insulating film and electrodes 36 are formed by interposing the through hole.

The electrodes having a narrow gap are formed by using the sample.

Figure 5A:
FIGS. 5A-5B show a sectional shape of a sample used in the invention.
Figure 5A:
Figure 5B:
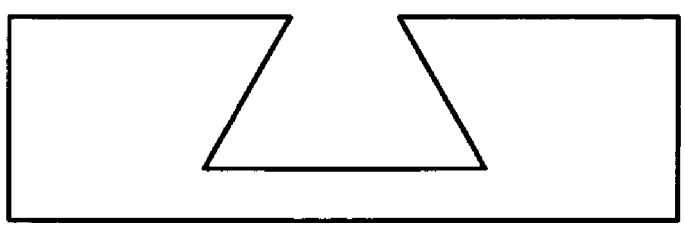

Although in FIGS. 2A-2C, a penetrated hole is used at the groove, a hole which is not penetrated can also be used. In this case, as shown by FIGS. 5A-5B, an inner wall of the hole becomes wider than an inlet thereof and in fabricating the electrodes, the inner wall is prevented from being formed with a deposition film.

The sample 20 is mounted to the focused ion beam apparatus shown in FIG. 1.

Figure 4A:
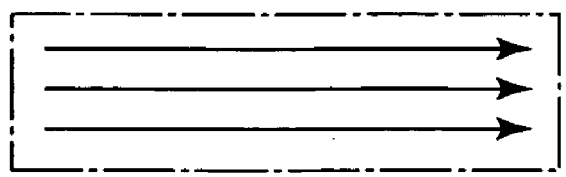
FIGS. 4A-4B show examples of scanning an ion beam in fabricating the electrode according to the invention.
Figure 4B:
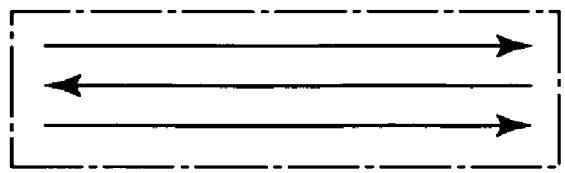

Needles of the manipulator 23 are brought into contact with the electrodes 36 of the sample. Under the state, as shown by FIG. 3, a machining frame 37 is set to ride over the through hole 35 and connect the electrodes 36, and the focused ion beam is irradiated simultaneously with blowing a gas of hexacarbonyltungsten constituting a raw material of tungsten deposition to the surface of the sample 20 by using the gas introducing apparatus 18. At this occasion, the focused ion beam may be scanned in one direction in the machining frame as shown by FIG. 4A, or may be scanned while reciprocating in the machining frame as shown by FIG. 4B.

A tungsten film is formed to ride over the through hole by scanning to irradiate the focused ion beam. The tungsten film is formed from both sides of the through hole. At this occasion, a potential difference is provided to the respective electrodes 36 by the voltage source 25. Further, when the gap between the electrodes becomes a nanometer order in accordance with growth of the tungsten film, a tunnel current is made to flow. For example, when the focused ion beam is prevented from reaching the surface of the sample 20 by controlling a control signal of the blanking electrode 13 when the potential difference becomes 2 mV and the tunnel current becomes 2 nA, the gap between the electrodes can be controlled to be equal to or smaller than 1 nm.

The tungsten film is formed by irradiating the focused ion beam while monitoring the ammeter by control means 41, and when the tunnel current becomes 2 nA, the focused ion beam is stopped to irradiate by the control signal from the controlling means 41.

Further, an arbitrary gap can reproducibly fabricated by controlling the applied voltage and the control current value.

What is claimed is:

1. A charged particle beam apparatus comprising:
   a charged particle source;
   a focusing lens system for focusing a charged particle beam drawn out from the charged particle source;
   a blanking electrode for making the focused charged particle beam ON/OFF on a sample;
   a deflection electrode for deflecting to scan the focused charged particle beam;
   a movable sample stage mounted with the sample irradiated with the focused charged particle beam;
   a gas gun for locally blowing a gas to a position of irradiating the focused charged particle beam on a surface of the sample;
   a secondary charged particle detector for detecting a secondary charged particle generated by irradiating the focused charged particle beam to the sample;
   two pieces of probers brought into contact with two points on the surface of the sample;
   a voltage source for applying a constant voltage between the two points with which the probers are brought into contact; and
   an ammeter for measuring a current flowing between the two points.

2. A charged particle beam apparatus according to claim 1, wherein the charged particle is an ion.

3. A charged particle beam apparatus according to claim 1, wherein the charged particle is an electron.

4. A charged particle beam apparatus according to claim 1, wherein the gas is an organic metal compound gas.

5. A method of forming electrodes having a narrow gap therebetween comprising the steps of:
   providing a sample the surface of which is constituted by an insulating member, two electrodes made of a conductive thin film being provided on the insulating member, and a groove being provided between the two electrodes;
   bringing the probers into contact with the two electrodes;
   setting a forming region of a conductive thin film to ride over the groove between the two electrodes;
   forming the conductive thin film by scanning the charged particle beam while blowing the gas to the forming region of the conductive thin film;
   applying the constant voltage to between the two electrodes;
   measuring a current flowing between the two electrodes;
   detecting that a current value becomes larger than a predetermined value; and
   finishing to scan the charged particle beam to the forming region of the conductive thin film.

6. A method of forming electrodes having a narrow gap therebetween according to claim 5, wherein the charged particle is scanned in one direction from a first electrode to a second electrode of the two electrodes previously formed on the surface of the sample.

7. A method of forming electrodes having a narrow gap therebetween according to claim 5, wherein the charged particle is scanned by being reciprocated between the first electrode and the second electrode of the two electrodes previously formed on the surface of the sample.

8. A method of forming electrodes having a narrow gap therebetween according to claim 5, wherein a width of the formed gap is controlled by changing the voltage applied between the electrodes.

9. A method of forming electrodes having a narrow gap therebetween according to claim 5, wherein the groove formed at the sample is a hole penetrated through a board.

10. A method of forming electrodes having a narrow gap therebetween according to claim 5, wherein the groove formed at the sample is provided with an inverse taper shape at a side wall thereof and is provided with a portion thereof which cannot directly be viewed from an inlet thereof.

11. A method of forming electrodes having a narrow gap therebetween comprising the steps of:
    forming a pair of electrodes opposed to each other by providing an insulating gap on a sample; and
    forming a conductive film to narrow the gap between the electrodes while applying a voltage between the electrodes and measuring a current flowing between the electrodes;
    finishing to form the conductive film when the current flowing between the electrodes becomes a predetermined value.

12. A method of forming electrodes having a narrow gap therebetween according to claim 11, wherein the conductive film is formed by gas assist deposition using a charged particle beam.

13. A method of forming electrodes having a narrow gap therebetween according to claim 11, wherein the gap is a through hole provided at a membrane portion of the sample.

14. A charged particle beam apparatus comprising:
    a charged particle source;
    a focusing lens system for focusing a charged particle beam drawn out from the charged particle source;
    a blanking electrode for making the focused charged electron beam ON/OFF on a sample;
    a deflection electrode for deflecting to scan the focused charged particle beam;
    a movable sample stage mounted with the sample irradiated with the focused charged particle beam;
    a gas gun for locally blowing a gas to a position of irradiating the focused charged particle beam on a surface of the sample;
    a secondary charged particle detector for detecting a secondary charged particle generated by irradiating the focused charged particle beam to the sample;
    two pieces of probers brought into contact with two points on the surface of the sample;
    a voltage source for applying a constant voltage between the two points with which the probers are brought into contact;
    an ammeter for measuring a current flowing between the two points; and
    control means for forming, a conductive film between the two points to narrow a gap therebetween by operating the deflection electrode and the gas gun, monitoring the current flowing between the two points, and making the focused charged particle beam irradiated to the surface of the sample off by the blanking electrode when the current becomes a predetermined value.

* * * * *